(12) United States Patent
Kumar et al.

(10) Patent No.: US 11,101,318 B2
(45) Date of Patent: Aug. 24, 2021

(54) BACK-SIDE MEMORY ELEMENT WITH LOCAL MEMORY SELECT TRANSISTOR

(71) Applicant: International Business Machines Corporation, Armonk, NY (US)

(72) Inventors: Arvind Kumar, Chappaqua, NY (US); Joshua M. Rubin, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/401,589

(22) Filed: May 2, 2019

(65) Prior Publication Data
US 2019/0259807 A1    Aug. 22, 2019

Related U.S. Application Data

(62) Division of application No. 15/654,282, filed on Jul. 19, 2017, now Pat. No. 10,446,606.

(51) Int. Cl.
*H01L 27/22* (2006.01)
*H01L 43/02* (2006.01)
(Continued)

(52) U.S. Cl.
CPC .......... *H01L 27/222* (2013.01); *H01L 27/228* (2013.01); *H01L 43/02* (2013.01);
(Continued)

(58) Field of Classification Search
CPC ....... H01L 27/222–228; H01L 27/2454; H01L 29/42392; H01L 29/7827; H01L 29/78642; H01L 27/11502–11514; H01L 27/11585–11597; H01L 2924/1441; H01L 21/28291; H01L 29/516; H01L 29/6684; H01L 29/78391; H01L 43/02; H01L 43/10; H01L 43/12; H01L 29/82;
(Continued)

(56) References Cited

U.S. PATENT DOCUMENTS 6,947,306 B2    9/2005    Poechmueller
7,371,627 B1    5/2008    Forbes
(Continued)

OTHER PUBLICATIONS

D. C. Worledge et al., "Spin torque switching of perpendicular Ta | CoFeB | MgO-based magnetic tunnel junctions," Applied Physics Letters, vol. 98, No. 2, 2011, 022501, 3 pages.
(Continued)

*Primary Examiner* — Nelson Garces
(74) *Attorney, Agent, or Firm* — Cantor Colburn LLP; Randall Bluestone

(57) ABSTRACT

A memory device includes a semiconductor device on a wafer. The semiconductor device includes a gate structure, a first source/drain region, and a second source/drain region. The gate structure is on the first side of the wafer. The first source/drain region is also on the first side of the wafer, and contacts a first end of the gate structure. The second source/drain region is on the second side of the wafer and extends into the first side to contact a second end of the gate structure. The memory device further includes a memory storage element on the second side of the wafer. The memory storage element contacts the second source/drain region.

4 Claims, 10 Drawing Sheets

(51) Int. Cl.
*H01L 43/12* (2006.01)
*G11C 11/56* (2006.01)

(52) U.S. Cl.
CPC ... *G11C 11/5607* (2013.01); *G11C 2211/5615* (2013.01); *H01L 43/12* (2013.01)

(58) Field of Classification Search
CPC ..... H01L 21/823487; H01L 29/66712–66734; H01L 29/7802–7815; H01L 51/057; H01L 21/8224; H01L 21/82285; H01L 27/0652; H01L 27/0658; H01L 27/0664; H01L 27/0716; H01L 27/0755–0777; H01L 27/0821; H01L 27/0823–0828; H01L 29/66333–66348; H01L 29/732–7327; H01L 29/7395–7398; H01L 28/40–92; G11C 11/5607; G11C 11/161; G11C 11/22–2297; G11C 11/5657; G11C 14/0072; G11C 5/02–05; G11C 11/14–1697; G11C 14/0036; G11C 14/0045; G11C 14/0081; G11C 19/02–10; G11C 19/14; G11C 2211/5615–5616; H01F 41/303; H01F 10/324–3295
USPC ........................................................ 257/252
See application file for complete search history.

(56) References Cited

U.S. PATENT DOCUMENTS

| | | |
|---|---|---|
| 7,402,866 B2 | 6/2008 | Liang et al. |
| 7,402,897 B2 | 7/2008 | Leedy |
| 7,696,567 B2 | 4/2010 | Haller et al. |
| 8,300,454 B2 | 10/2012 | Kramer et al. |
| 9,048,337 B2 | 6/2015 | Forbes |
| 2007/0296002 A1 | 12/2007 | Liang et al. |
| 2010/0038743 A1* | 2/2010 | Lee ............... H01L 27/0688 257/499 |
| 2011/0143506 A1 | 6/2011 | Lee |
| 2015/0079739 A1 | 3/2015 | Chen |
| 2016/0118406 A1 | 4/2016 | Nygaard et al. |
| 2016/0148943 A1 | 5/2016 | Hasegawa et al. |
| 2016/0284761 A1 | 9/2016 | Zhou et al. |
| 2018/0277594 A1* | 9/2018 | Kanda ............. H01L 27/2436 |

OTHER PUBLICATIONS

International Search Report and Written Opinion for International Application No. PCT/IB2018/055340; Application filing Date Jul. 18, 2018; dated Oct. 25, 2018 (9 pages).

Kumar et al., "Back-Side Memory Element With Local Memory Select Transistor", U.S. Appl. No. 15/654,282, filed Jul. 19, 2017.

List of IBM Patents or Patent Applictions Treated As Related; (Appendix P), Date Filed May 3, 2019, 2 pages.

S. Verma et al., "Novel 4 F 2 Buried-Source-Line STT MRAM Cell With Vertical GAA Transistor as Select Device," IEEE Transactions on Nanotechnology, vol. 13, No. 6, 2014, pp. 1163-1171.

S. Verma, et al., "Low-Power High-Density STT MRAMs on a 3-D Vertical Silicon Nanowire Platform," IEEE Transactionson Very Large Scale Integration (VLSI) Systems, vol. 24, No. 4, Apr. 2016, pp. 1371-1376.

\* cited by examiner

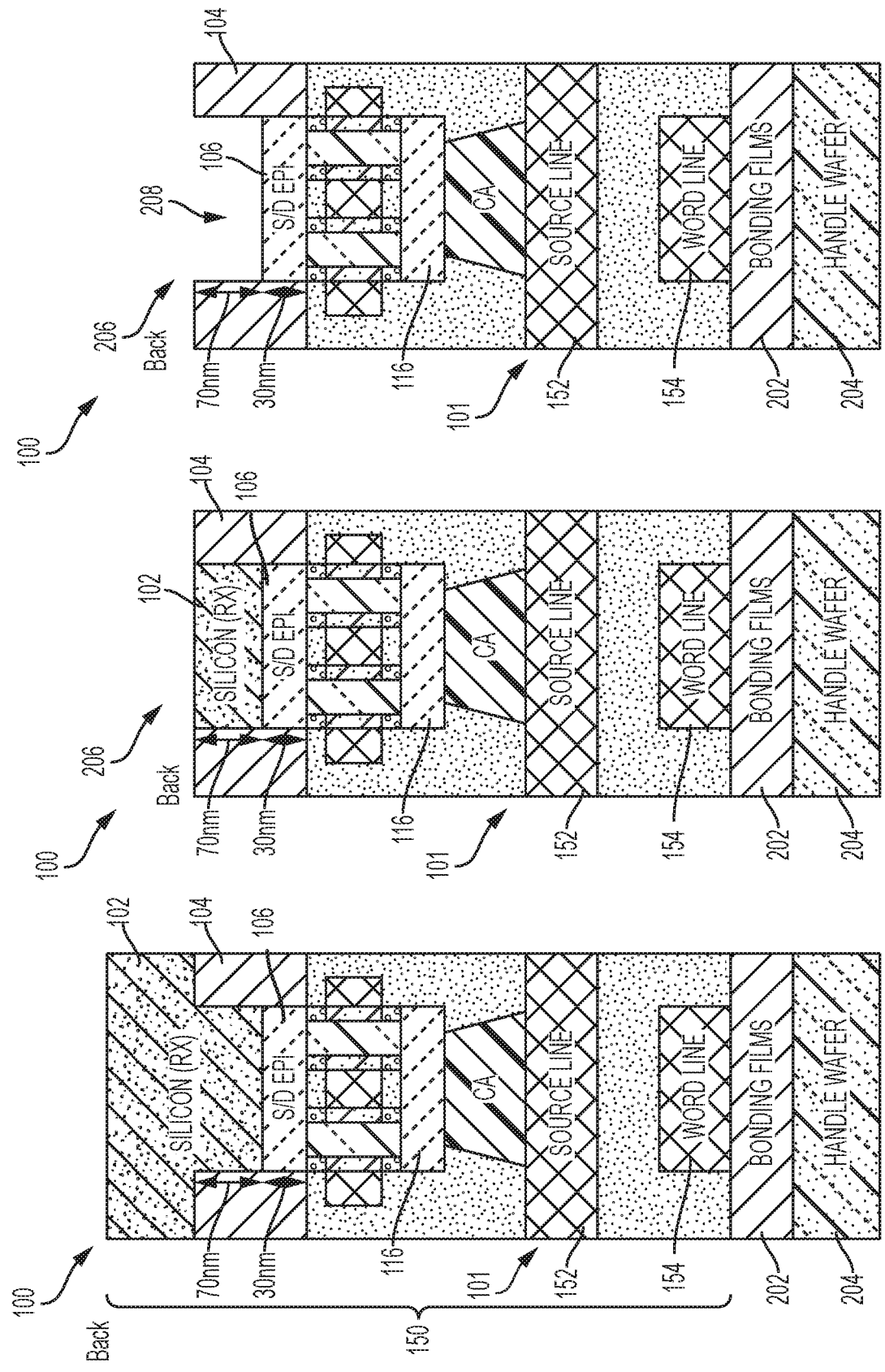

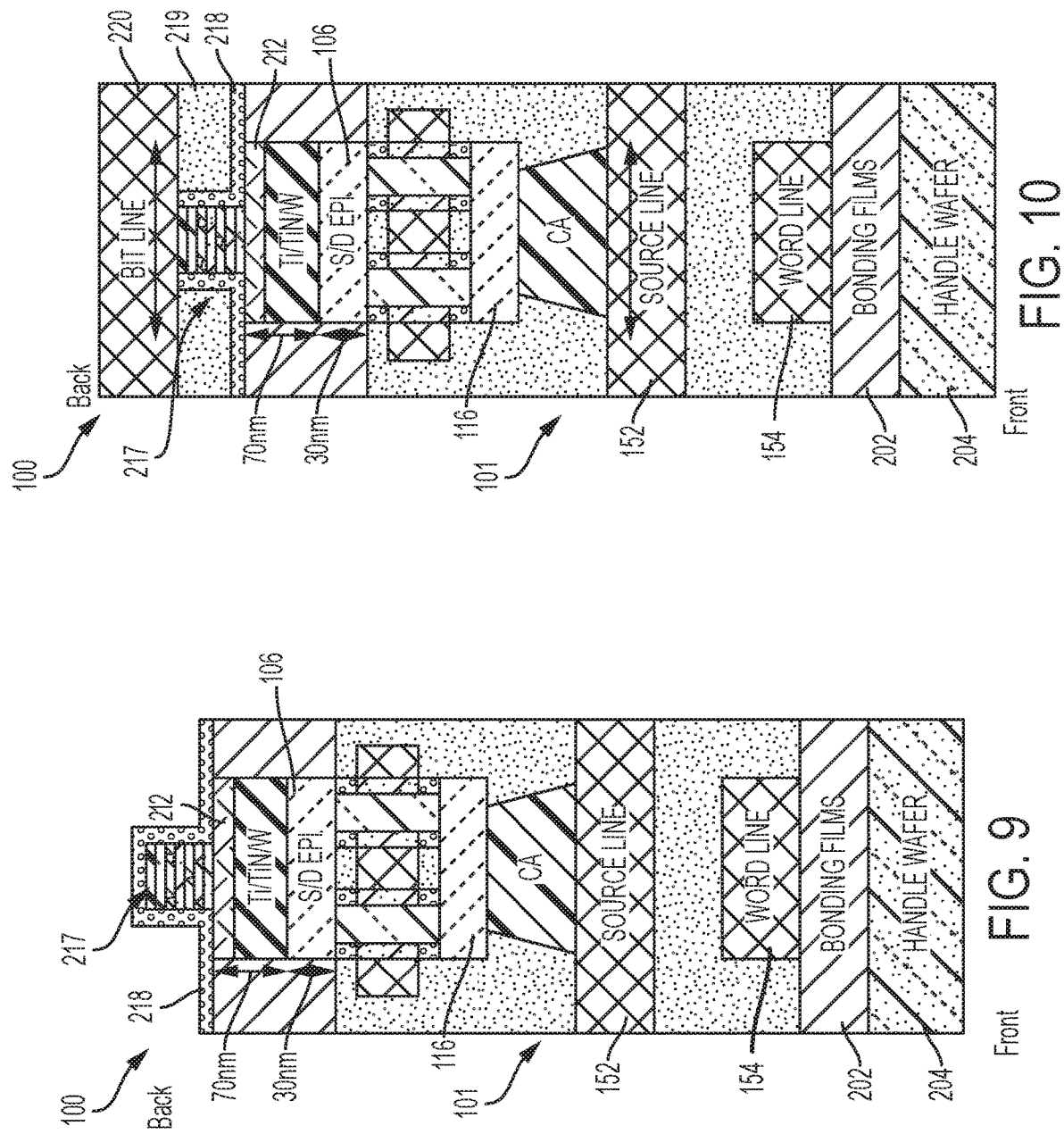

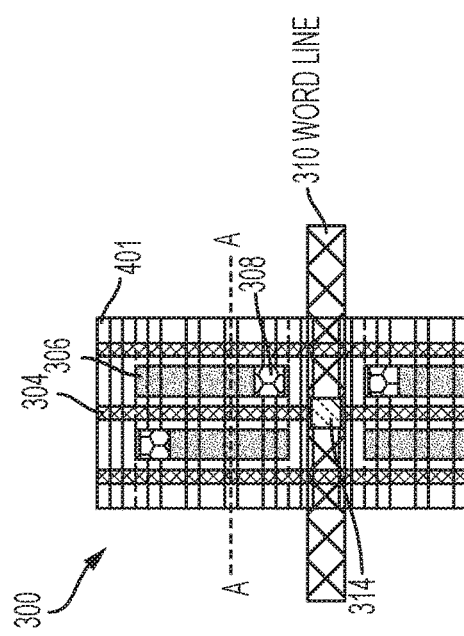
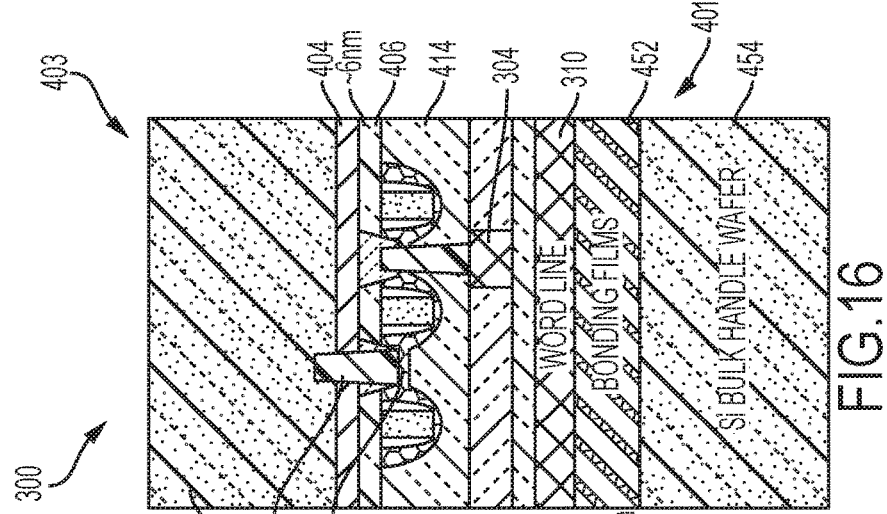
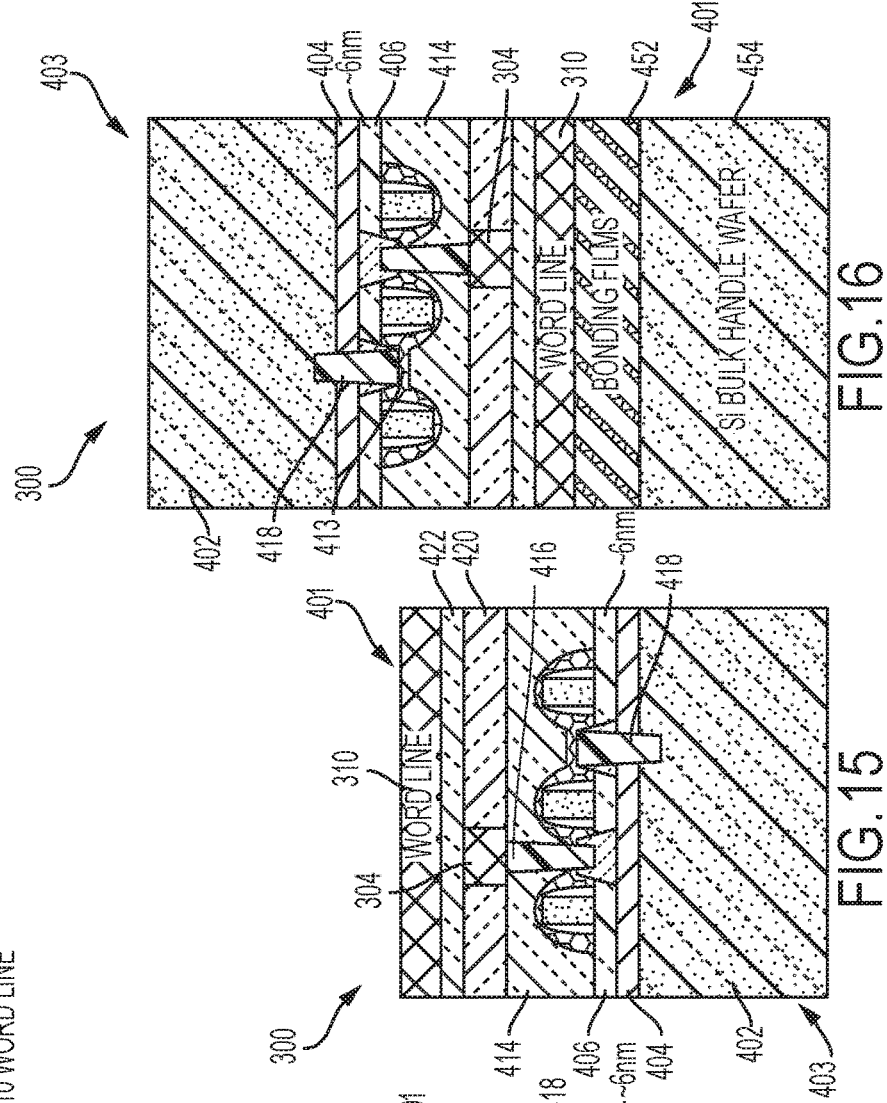
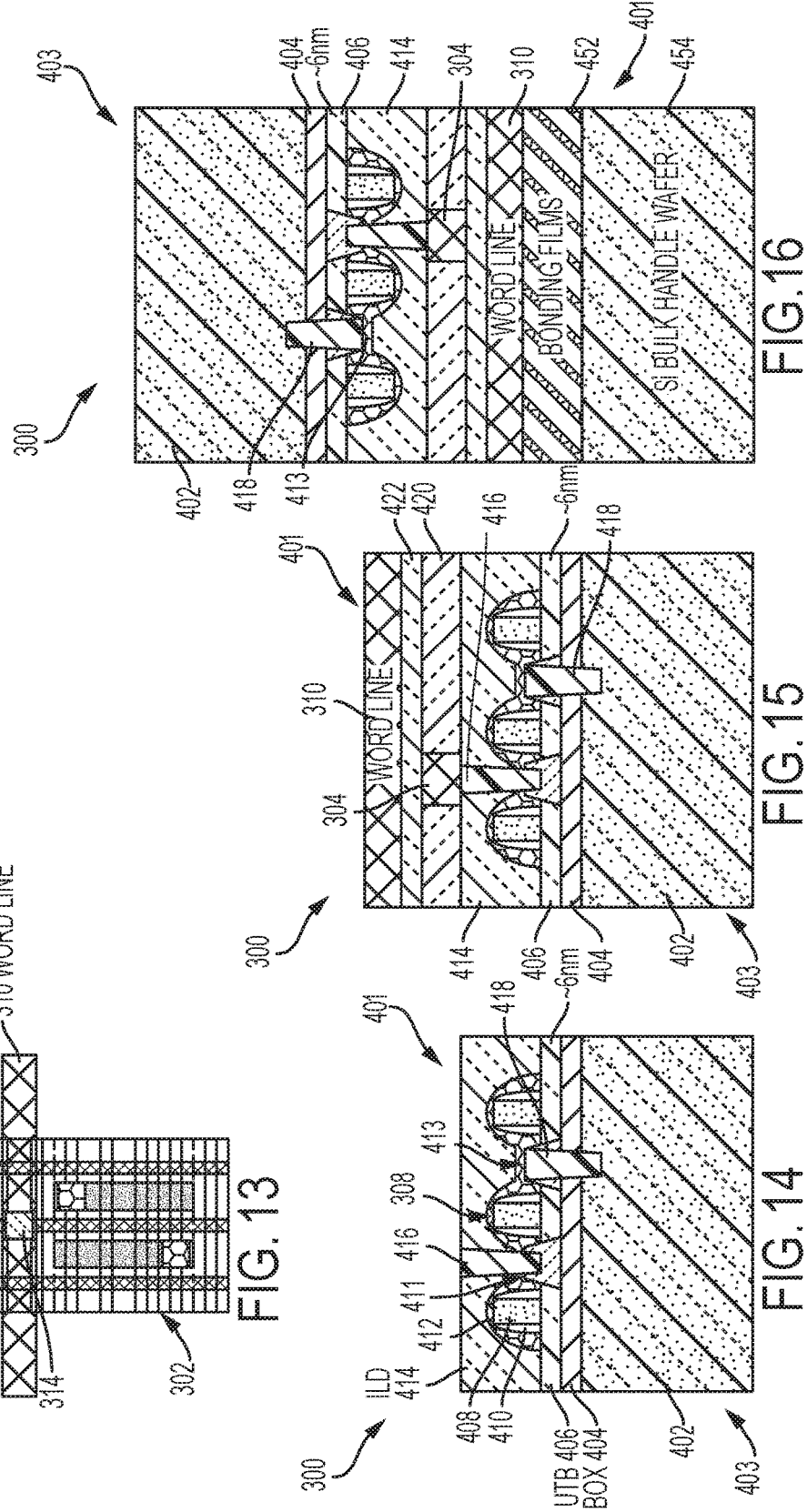
FIG. 13
FIG. 14
FIG. 15
FIG. 16

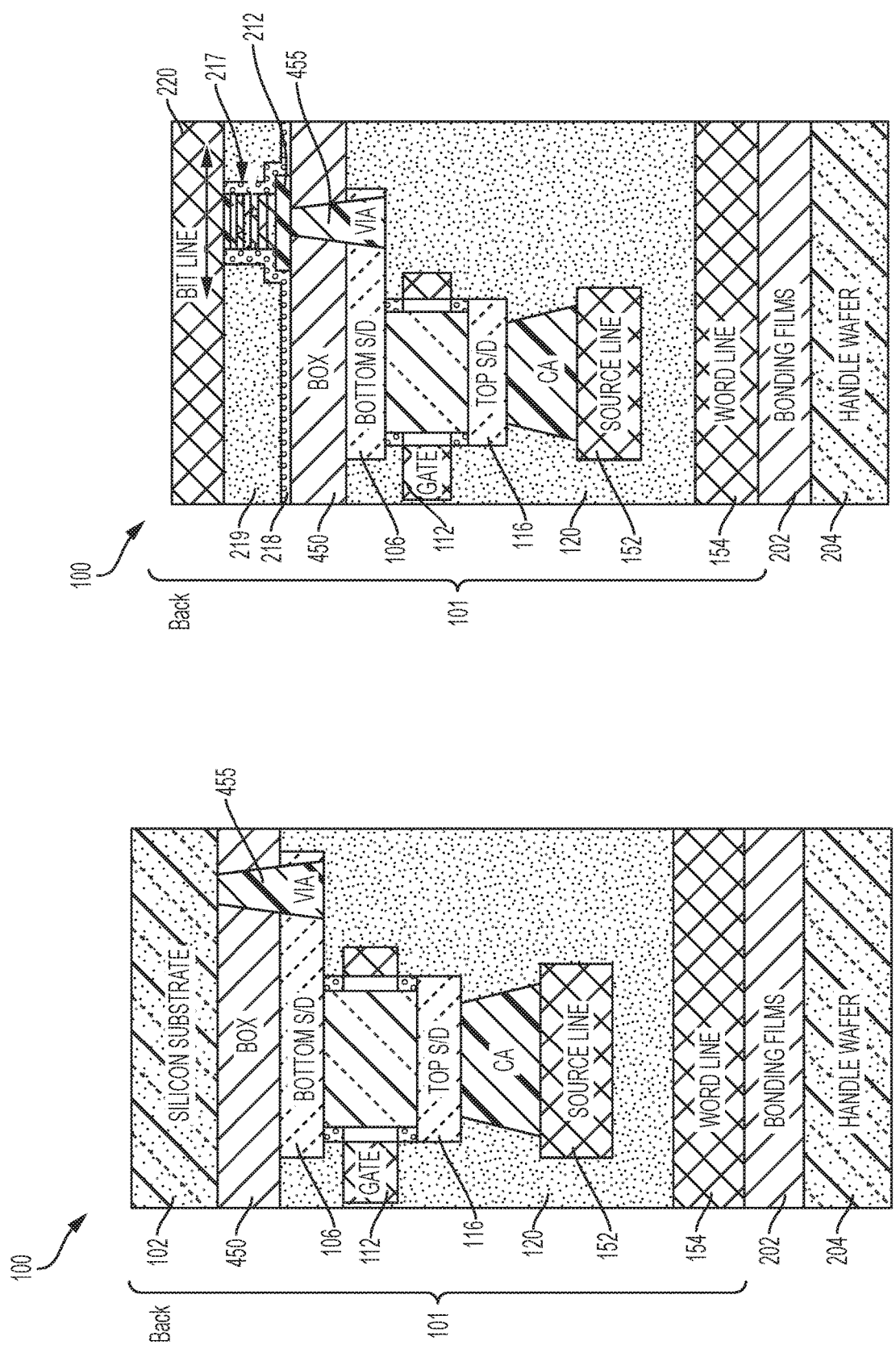

BACK-SIDE MEMORY ELEMENT WITH LOCAL MEMORY SELECT TRANSISTOR

DOMESTIC PRIORITY

This application is a divisional of U.S. patent application Ser. No. 15/654,282, filed on Jul. 19, 2017, the disclosures of which are incorporated by reference herein in its entirety.

BACKGROUND

The present invention relates in general to fabrication methods and resulting structures for semiconductor memory and storage devices, and more specifically, to nonvolatile memory devices.

Unlike conventional random access memory (RAM) chip technologies, data in magnetic RAM (MRAM) is not stored as electric charge or current flows, but by magnetic storage elements. The magnetic storage elements are formed from two ferromagnetic plates, each of which can hold a magnetization. The two ferromagnetic plates are separated from each other by a thin insulating layer to define a magnetic tunnel junction (MTJ). One of the two ferromagnetic plates is a permanent magnet set to a particular magnetization direction, while the other ferromagnetic plate has a magnetization direction that can be changed to match that of an external field or that can be changed using an applied current to store data.

SUMMARY

Embodiments of the present invention are directed to a method for fabricating a memory device. A non-limiting example of the method includes forming, on a first side of a semiconductor wafer, a semiconductor device including at least one gate structure and a first source/drain region. The method further includes forming, on a second side of the semiconductor wafer opposite the first side, a memory storage element such that the memory storage element is in electrical communication with a second source/drain region of the semiconductor device different from the first source/drain region.

Embodiments of the present invention are directed to a memory device that includes a semiconductor device on a wafer. The semiconductor device includes a gate structure, a first source/drain region, and a second source/drain region. The gate structure is on the first side of the wafer. The first source/drain region is also on the first side of the wafer, and contacts a first end of the gate structure. The second source/drain region is on the second side of the wafer and extends into the first side to contact a second end of the gate structure. The memory device further includes a memory storage element on the second side of the wafer. The memory storage element contacts the second source/drain region.

Embodiments of the present invention are directed to a method for fabricating a memory device. A non-limiting example of the method includes forming, on a first side of a semiconductor wafer, a semiconductor device including at least one gate structure, a first source/drain region and a second source/drain region, the first source/drain region having a length greater than the second source/drain region to define an extended portion that extends beyond the second source/drain region. The method further includes forming, on the first side of the semiconductor wafer, a buried insulator layer on an upper surface of the first source/drain region. The method further includes forming an electrically conductive punchthrough via that extends through the buried insulator layer and contacts the extended portion such that the punchthrough via is off-set with respect to the gate structure. The method further includes forming, on a second side of the semiconductor wafer opposite the first side, an off-set memory storage element, the off-set memory storage element contacting a surface of the punchthrough via and being off-set with respect to the gate structure.

Embodiments of the present invention are directed to a method for fabricating a memory device. A non-limiting example of the method includes forming, on a first side of a semiconductor wafer, a semiconductor device including at least one gate structure and a first source/drain region. The method further includes forming, on the first side of the semiconductor wafer, a buried insulator layer on an upper surface of the first source/drain region. The method further includes forming, on a second side of the semiconductor wafer opposite the first side, an electrically conductive via/contact that extends through the buried insulator layer and contacts the first S/D region. The method further includes forming, on the second side of the semiconductor wafer, a memory storage element such that the memory storage element and the via/contact are each in electrical communication with a second source/drain region of the semiconductor device different from the first source/drain region.

Additional benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other advantages of the embodiments of the invention are apparent from the following detailed description taken in conjunction with the accompanying drawings in which:

FIG. 3 illustrates a flipped orientation of the VTFET according to embodiments of the invention;

FIG. 4 illustrates the VTFET after recessing the back-side of the wafer according to embodiments of the invention;

FIG. 5 illustrates the VTFET after exposing a buried source/drain region according to embodiments of the invention;

FIG. 9 illustrates the MRAM device after patterning the MTJ layer to form a magnetic storage element according to embodiments of the invention; and FIG. 10 illustrates the MRAM device after forming a bit line on the magnetic storage element according to embodiments of the invention.

FIG. 13 is a front-side view of a wafer including a planar memory access FET according to embodiments of the invention;

FIG. 14 is a cross-sectional view taken along line A-A of the wafer shown in FIG. 13 according to embodiments of the invention;

FIG. 15 illustrates a memory array following formation of a word line and a source line on the font-side of the wafer according to embodiments of the invention;

FIG. 16 is a flipped orientation of the wafer after stacking a bonding film and bulk handle wafer on the word line according to embodiments of the invention;

FIG. 19 is a cross-sectional view of a wafer including an off-set punchthrough via contacting a source/drain region of a VTFET according to embodiments of the invention; and FIG. 20 illustrates a plurality of MTJ layers stacked on the off-set punchthrough via to form an off-set memory element according to embodiments of the invention.

Figure 1:
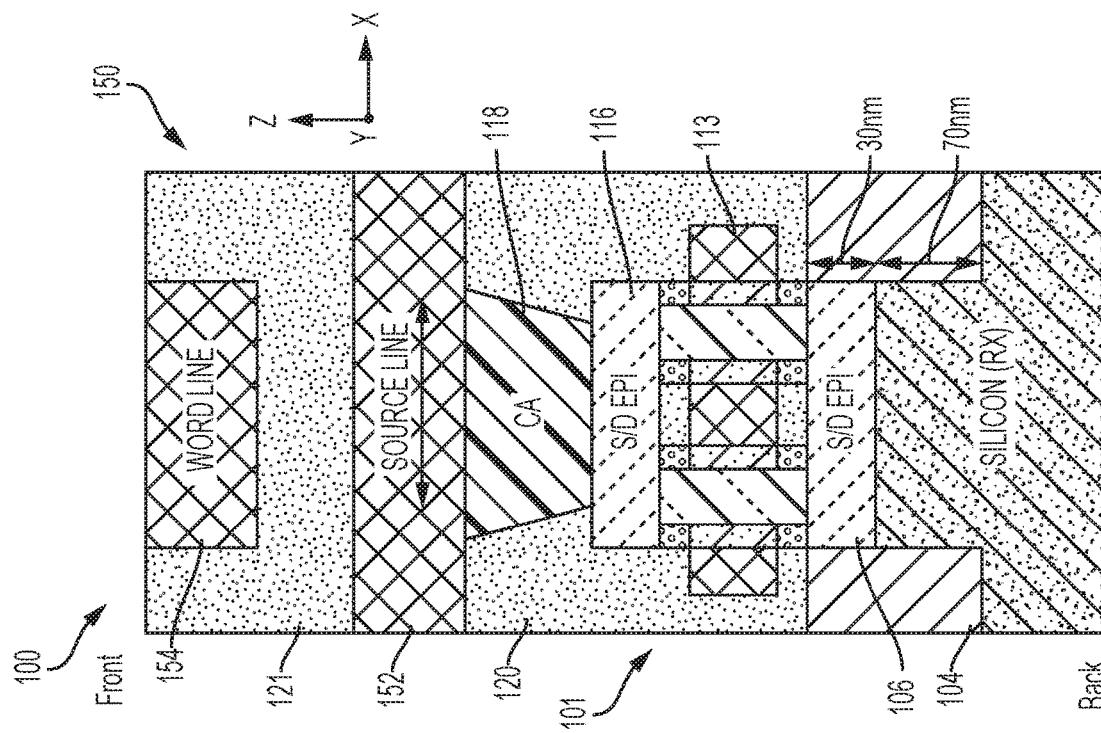
FIG. 1 is a cross-sectional view of a vertical-type field effect transistor (VTFET) formed on a wafer according to embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

The term "RAM", and variations thereof, are used in this detailed description to describe a data storage device capable of storing one or more data bits (e.g., a "0" or "1"). The phrase "intermediate semiconductor device," and variations thereof, refers to a semiconductor device in a stage of fabrication prior to a final stage.

Turning now to an overview of technologies that are more specifically relevant to aspects of the invention, nonvolatile memory (NVM) technologies have emerged that aim to provide a NVM device with improved processing speeds and high density, while offering low current leakage at a reduced device footprint. These emerging NVM technologies include phase-change random access memory (PCRAM), resistive random access memory (ReRAM), ferroelectric random access memory (FeRAM), and magnetoresistive random access memory (MRAM). MRAM devices, for example, offer benefits over traditional electrically-charged and current-based semiconductor memory devices, which include, for example, dynamic random access memory (DRAM) and flash memory. For instance, the memory element of a DRAM device is a capacitor that loses its charge over time. As a result, memory assemblies that use DRAM must refresh all the cells in their chips approximately 20 times a second, reading each one and re-writing its contents. As DRAM cells decrease in size, it is necessary to refresh the cells more often resulting in greater power consumption.

Because MRAM devices employ a MTJ to facilitate magnetic data storage, MRAM devices do not require constant charge refreshing. Accordingly, MRAM devices retain memory with the power turned off without requiring constant power consumption thereby providing substantial improvements in overall power efficiency. Fabrication of the MTJ, however, can require exotic materials such as, for example, non-CMOS compatible materials, magnetic ferrite materials, etc. In addition, MRAM devices fabricated according to traditional back end of line (BEOL) processes suffer from constrained dimensions that hinder efforts to reduce the overall MRAM footprint.

Turning now to an overview of aspects of one or more embodiments of the invention, a back-side memory architecture is described that provides a memory device (e.g., PCRAM device, ReRAM device, FeRAM device, MRAM device, etc.). The back-side memory architecture includes an access transistor on a first surface (e.g., front-side) of a semiconductor wafer and a memory element on the opposing second surface (e.g., back-side) of the wafer. The access transistor can be formed as a vertical-type field effect transistor (VTFET) that includes an embedded memory contact that contacts a magnetic memory element formed on the back-side of the wafer. The access transistor can also be formed as a planar-type FET or finFET that utilizes a punchthrough contact to facilitate electrical connection with a magnetic memory element formed on the back-side of the wafer. In either instance, a MRAM device can be fabricated having a reduced footprint.

Aspects of one or more embodiments of the invention address the above-described shortcomings of the prior art because the back-side memory architecture described herein overcomes MTJ height constraints that hinder conventional BEOL fabrications techniques. This back-side memory architecture also allows for passing a back-side bit line, along the edge of the memory array, to the front-side thereby further reducing the overall footprint of the MRAM device.

Turning now to a more detailed description of aspects of the invention, FIG. 1 depicts an intermediate semiconductor device 100 according to one or more non-limiting embodiments. The intermediate semiconductor device 100 includes a wafer 101 that extends along a first axis (e.g., X-axis) to define a length, a second axis (e.g., Y-Axis) to define width, and a third axis (e.g., Z-axis) to define a height. The wafer 101 has a first side and a second side located opposite the first side. The first side will be referred to as a front-side (designated as Front), for example, while the second side will be referred to as a back-side (designated as Back), for example.

In one or more embodiments, the intermediate semiconductor device 100 further includes a transistor device such as a VTFET, for example. The VTFET has one or more channel regions 110 vertically arranged between a first source/drain (S/D) region 116 and a second S/D region 106. The first S/D region 116 will be referred to as an upper S/D region 116 and the second S/D region 106 will be referred to as a lower S/D region 106. The upper S/D region 116 and lower S/D region 106 are composed of a semiconductor material such as silicon (Si) or silicon germanium (SiGe), for example, and can be formed according to one or more epitaxy processes. The epitaxy process can be carried out using various well-known techniques including, but not limited to, vapor phase epitaxy (VPE), molecular beam epitaxy (MBE) or liquid phase epitaxy (LPE) with a gaseous or liquid precursor, such as, for example, silicon tetrachloride.

The VTFET further has one or more gate structures 113. Each gate structure 113 includes a gate dielectric layer 114 that encapsulates the channel region 110, and an electrically conductive contact 112 that wraps around all portions of the gate dielectric layer 114. Accordingly, the vertical orientation of the channel region 110 allows the gate structure 113 to encapsulate or wrap around all walls of the channel region 110 thereby improving electrostatic gate control while offering the potential to reduce gate voltages. S/D spacers 108 are formed between the gate dielectric layer 114 and the S/D regions 106 and 116, respectively, to assist in electrically isolating the S/D regions from the gate structure 113. During operation, current flows through the channel region 110 in a vertical direction between the upper S/D region 116 and the lower S/D region 106, and thus flows primarily normal to the top surface of the device.

A first interlayer dielectric (ILD) 120 is formed on the front-side of the wafer 101 and encapsulates the gate structure 113 and the upper S/D region 116. A first via 118 is formed in the first ILD 120 to provide electrical access to the upper S/D region 116. For instance, one or more masks and patterning operations can be performed to form a void in the first ILD layer 120 that exposes an upper surface of the upper S/D region 116. The void can be subsequently filled with an electrically conductive material such as a metal material, for example, to form the first 118. A chemical-mechanical planarization (CMP) process can be performed to remove excess metal material from the upper surface of the ILD 120. Accordingly, upper surfaces of the ILD 120 and the first via 118 are flush (i.e., coplanar) with one another.

Still referring to FIG. 1, the lower S/D region 106 is formed as a buried S/D region and contacts a semiconductor layer 102. The semiconductor layer 102 can be composed of various semiconductor materials including, but not limited to, Si, and can be used as a seed layer to epitaxially grow the lower S/D region 106.

The back-side of the wafer 101 can further include shallow trench isolation (STI) regions 104 that serve to electrically isolate the lower S/D region 106 from neighboring semiconductor devices (not shown). The STI regions 104 can be formed with a desired height that serves to control a height of a memory device contact (not shown in FIG. 1) to be formed on the back-side of the wafer 101 according to subsequent fabrication processes discussed in greater detail below. In one or more non-limiting embodiments, the STI regions 104 have a total height of approximately 100 nanometers (nm), for example. The difference (e.g., 70 nm) between the total height of the STI regions 104 (e.g., 100 nm) and the total height of the lower S/D region 106 (e.g., 30 nm) will define the height of the memory device contact described in greater detail below.

Figure 2:
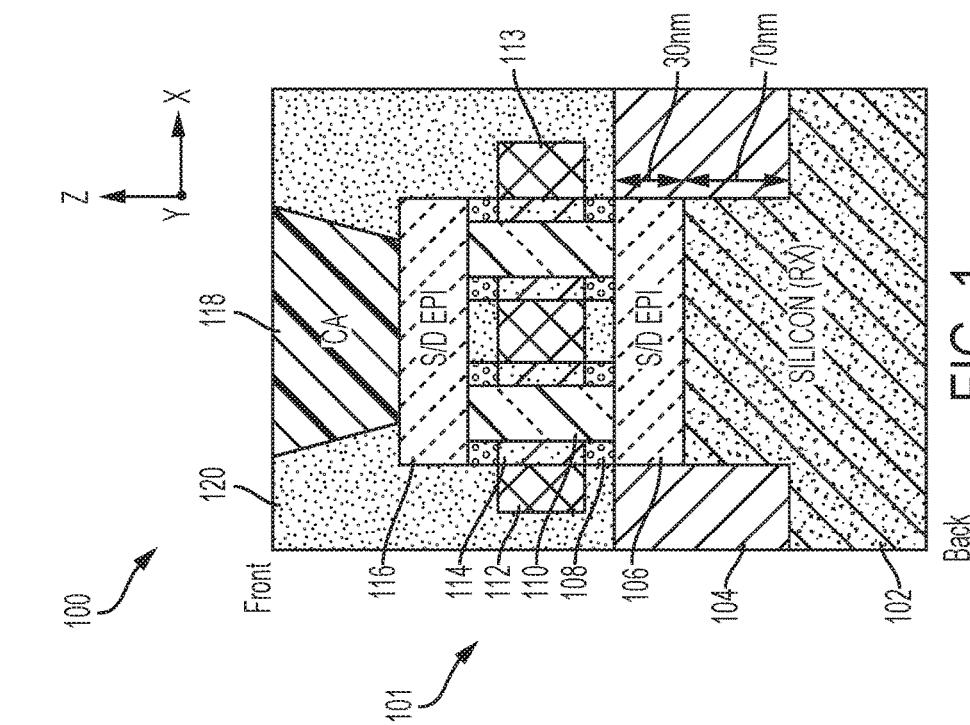
FIG. 2 illustrates the VTFET following the formation of a word line and source line on the front-side of the wafer according to embodiments of the invention.

FIG. 2 illustrates the intermediate semiconductor device of FIG. 1 following the formation of a memory line array 150 on the front-side of the wafer 101. The memory line array includes a source line 152 and a word line 154. One or more back end of line (BEOL) fabrications processes can be performed to form the source line 152 and word line 154. For example, the source line 152 composed of an electrically conductive material is initially formed on the upper surface of the first ILD 120. The source line 152 extends along the first axis (e.g., the X-axis) such that a portion of the source line 152 contacts an upper surface of the first via 118. A second ILD 121 is deposited on an upper surface of the source line 152, and is then patterned to form a void that defines the dimensions of the word line 154. The void is then filled with an electrically conductive material to form the word line 154, which is separated from the source line 152 by a second ILD 120 and extends in a direction opposite to the source line 152 (e.g., along the Y-axis).

Referring now to FIGS. 3-10, the semiconductor device 100 is shown after flipping the wafer 101. Accordingly, various fabrication processes can be applied to the back-side of the wafer 101 to form a back-side memory element (not shown in FIG. 3). It should be appreciated that the wafer 101 can be flipped after stacking a bonding film 202 and bulk handle wafer 204 on top of the word line 154. Additional metal lines and/or vias can also be formed on the front-side beyond the word line, depending on the application of the device. For example, a first portion of the word line 154 can be formed on the front-side of the wafer 101 while a second portion of the word line 154 is passed to the backside of the wafer 101.

The handle wafer 204 is formed on the bonding film 202. The bonding film 202 is composed of an adhesive material or polyimide having a Si adhesive. Alternatively, the bonding film 202 can be composed of an oxide-based or nitride-based material to facilitate bonding to dielectric materials. The bonding film 202 can be formed of a single layer, or can include multiple layers. The bulk handle wafer 204 can be composed of various materials such as Si, for example, and can provide additional support when performing one or more subsequent fabrication processes.

Turning to FIG. 4, the semiconductor device 100 is illustrated after recessing the semiconductor layer 102. The semiconductor layer 102 can be recessed using various techniques including, but not limited to, a wafer grinding, a reactive ion etching (RIE) process, or a CMP process. When applying a CMP process, for example, the semiconductor layer 102 can be recessed until reaching STI regions 104 (i.e., stopping on the STI regions 104). Accordingly, exposes surfaces of the STI regions 104 and the remaining semiconductor layer 102 are flush (i.e., co-planar) with one another.

Turning to FIG. 5, the semiconductor device 100 is illustrated after removing the remaining semiconductor layer 102 to expose the underlying lower S/D region 106. A selective etching process can be performed that selectively etches away the remaining semiconductor layer 102 while preserving the STI regions 104 and the lower S/D region 106. Accordingly, a void 208 is formed that exposes the underlying lower S/D region 106.

The selective etching process includes, for example, a wet etching process that utilizes an ammonium hydroxide (NH$_4$OH) chemistry. When the semiconductor layer 102 is formed of Si and the lower S/D region 106 is formed of SiGe, a wet etching process composed of a NH$_4$OH chemistry can be used that attacks the Si material of the semiconductor layer 102 more aggressively than the SiGe material of the lower S/D region 106. For instance, the NH$_4$OH chemistry can achieve an etching ratio of 4:1, i.e., can etch the Si material four times more aggressively than the SiGe material. SiGe is generally found in the S/D region of pFETs. Alternatively, the access transistor (e.g., VTFET) can be fabricated as an nFET that can include SiC S/D regions 106. In this case, Si removal can be achieved using a chemistry that aggressively attacks the Si material of the semiconductor layer 102 while preserving the SiC material of the S/D region 106. Carbon doping can also be applied to vary the etch ratio between the materials.

Figure 6:
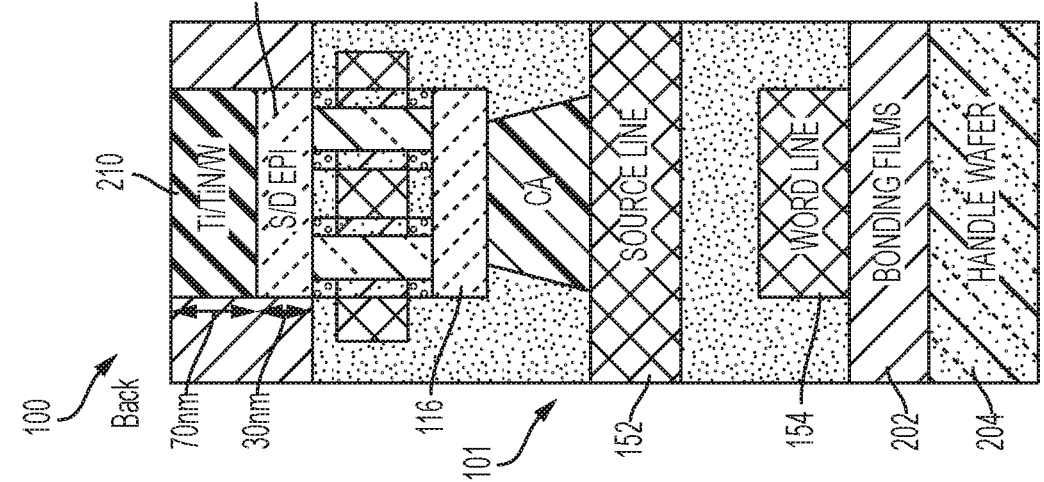
FIG. 6 illustrates the VTFET after forming a back-side source/drain contact according to embodiments of the invention.

With reference now to FIG. 6, the semiconductor device 100 is illustrated after depositing an electrically conductive material in the void 208 to form a S/D contact 210 on the lower S/D region 106. The electrically conductive material can be a metal material including, but not limited to, titanium (Ti), titanium nitride (TiN), and tungsten (W). Excess conductive material can be removed from the backside of the wafer 101 by performing a CMP process that stops on the STI regions 104. Accordingly, the exposed surface of the S/D contact 210 is flush with exposed surface of the STI regions 104. Although the height of the S/D contact 210 is illustrated as 70 nm, dimensions of the S/D contact 210 are not limited thereto.

Figure 7:
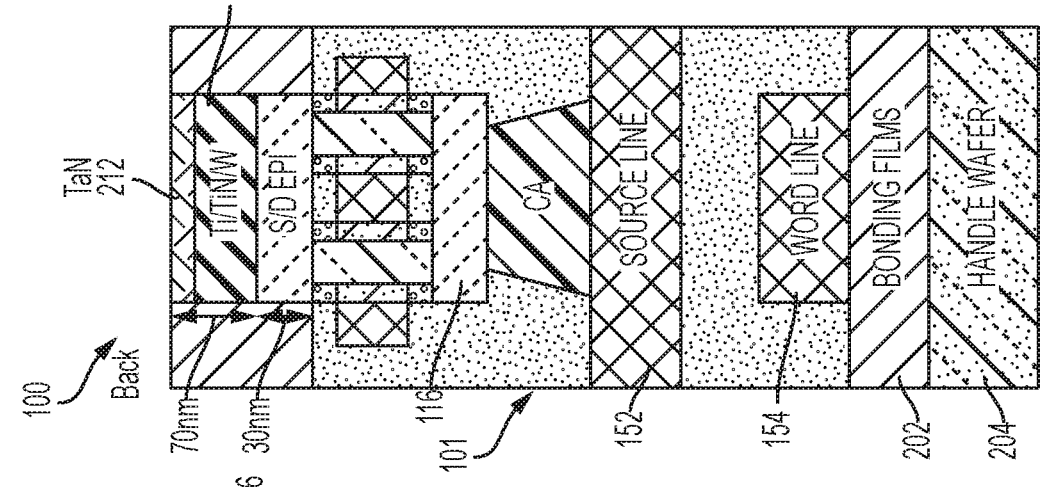
FIG. 7 illustrate the VTFET after forming a memory contact on the back-side source/drain contact according to embodiments of the invention.

Turning to FIG. 7, the S/D contact 210 can be partially recessed below the surfaces of the STI regions 104. A RIE process that incorporates a fluorine-based chemistry, for example, can be used to a recess S/D contact 210 composed of Tungsten (W). Although not illustrated, the S/D contact 210 can include one or more contact liners. For example, a first liner (not shown) composed of titanium (Ti) can be deposited on the S/D contact 210. Thereafter, a second liner (not shown) composed of titanium-nitride (TiN) can be deposited on the first liner (e.g., Ti liner).

The resulting cavity can be filled with a second conductive material such as TaN, for example, to form a memory contact 212. The memory contact 212 is optional and can be omitted from one or more of the embodiments of the invention. The second conductive material 212 can be deposited using various processes such as, for example, physical vapor deposition (PVD), or other sputtering techniques. Accordingly, the S/D contact 210 can be completed by performing various fabrication techniques to the backside wafer 101. In addition, the back-side formation of the S/D contact 210 and memory contact 212 results in self-alignment of the lower S/D region 106, the back-side formation of the S/D contact 210, and memory contact 212. In other words, the buried lower S/D region 116 can be utilized to form a self-aligned contact for a memory element, which is discussed in greater detail below. The contact (also referred to as a landing pad) can be etch resistive and serve as protection for underlying elements and structures during patterning of the backside memory element.

Figure 8:
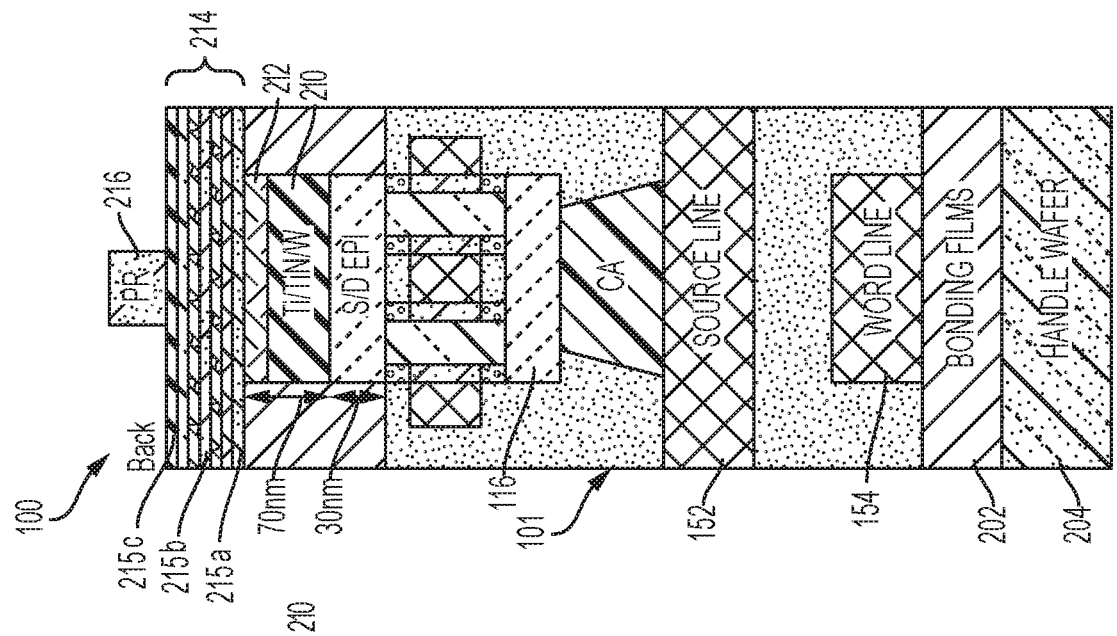
FIG. 8 illustrates the VTFET after stacking a plurality of MTJ layers on the memory contact to form an MRAM device according to embodiments of the invention.

With reference now to FIG. 8, memory storage element 214 is formed on exposed surfaces of the memory contact 212 and the STI regions 104. Going forward, the memory storage element 214 will be described in terms of a MRAM storage element. It should be appreciated, however, that the invention is not limited thereto and that various other types of memory storage elements can be implemented without departing from the scope of the invention.

In one or more non-limiting embodiments, the MRAM storage element 214 is formed as a memory stack 214 that includes a plurality of individual magnetic tunnel junction (MTJ) layers 215a-215c vertically arranged on top of one another. The MTJ layers include, for example, a fixed magnetic layer 215a, a dielectric tunnel barrier layer 215b, and a free magnetic layer 215c. The fixed magnetic layer 215a is formed on the memory contact 212. The free magnetic layer 215c is located above the fixed magnetic layer 215a. The dielectric tunnel barrier layer 215b is interposed between the fixed magnetic layer 215a and the free magnetic layer 215c. The fixed magnetic layer 215a and the free magnetic layer 215c are composed of a ferromagnetic material. The dielectric tunnel barrier layer 215b is composed of an oxide or metal-oxide material such as aluminum oxide (AlO$_2$), for example. Accordingly, the stack of MTJ layers 215a-215c defines a MTJ that is capable of facilitating magnetic storage to form a MRAM bit/cell.

The MTJ layers 215a-215c can be deposited using, for example, a PVD process. Each MTJ layer 215a-215c can have a vertical thickness (e.g., extending along the Z-axis) ranging from approximately 10 nm or less. Although three MTJ layers 215a-215c are described herein, the number of MTJ layers is not limited thereto.

Still referring to FIG. 8, a photoresist mask 216 is formed on the memory stack 214. The photoresist 216 mask can be formed by first depositing a photoresist layer on the memory stack, and then performing a lithography patterning process.

Turning to FIG. 9, the semiconductor device 100 is illustrated after performing an ion beam etch (IBE) process, which transfers the pattern defined by the photoresist mask 216 into the memory stack 214. Accordingly, a magnetic storage element 217 (e.g., MRAM element 217) is formed on the memory contact 212. Thus, unlike conventional MRAM devices, which include an MRAM element and an access transistor formed on only a single side (e.g., front-side) of a wafer, one or more non-limiting embodiments of the invention described herein provide a MRAM element 217 on a first side (e.g., back-side) of the wafer 101, while the access transistor (e.g., VTFET) is on the opposite side (e.g., front-side) of the wafer 101.

Still referring to FIG. 9, a memory stack insulating film 218 is deposited that encapsulates the MRAM element 217. The memory stack insulating film 218 is composed of a nitride material such as silicon nitride (SiN), for example, and is deposited according to a chemical vapor deposition (CVD) process, for example. The insulating film 218 assists in film adhesion while also inhibiting diffusion of metal atoms from surfaces of the MRAM element 217. The insulating film 218 can also limit thermal degradation of the of the MRAM element 217 during further processing.

Referring to FIG. 10, a third ILD layer 219 is deposited on the insulating film 218 to encompass the MRAM element 217. The third ILD layer 219 is then recessed to expose an upper surface of the insulating film 218. A RIE process can be performed to recess the ILD layer 219 and can be continued until the upper surface of the insulating film 218 is removed and the underlying MRAM element 217 is exposed. Alternatively, a first etching process can be performed to recess the ILD layer 219 until the upper surface of the insulating film 218 is exposed. A different etching process (e.g., an etching process using a different chemistry)

can then be used to remove the upper surface of the insulating film 218 to expose the underlying MRAM element 217.

Still referring to FIG. 10, a bit line 220 composed of an electrically conductive material is formed on the third ILD 219. The bit line 220 extends along the first axis (e.g., the X-axis) such that a portion of the bit line 220 contacts the exposed surface of the MRAM element 217. Although not shown, the wafer 101 can again be flipped following formation of the bit line 220, and front-side component processing can be continued if necessary.

Figure 11:
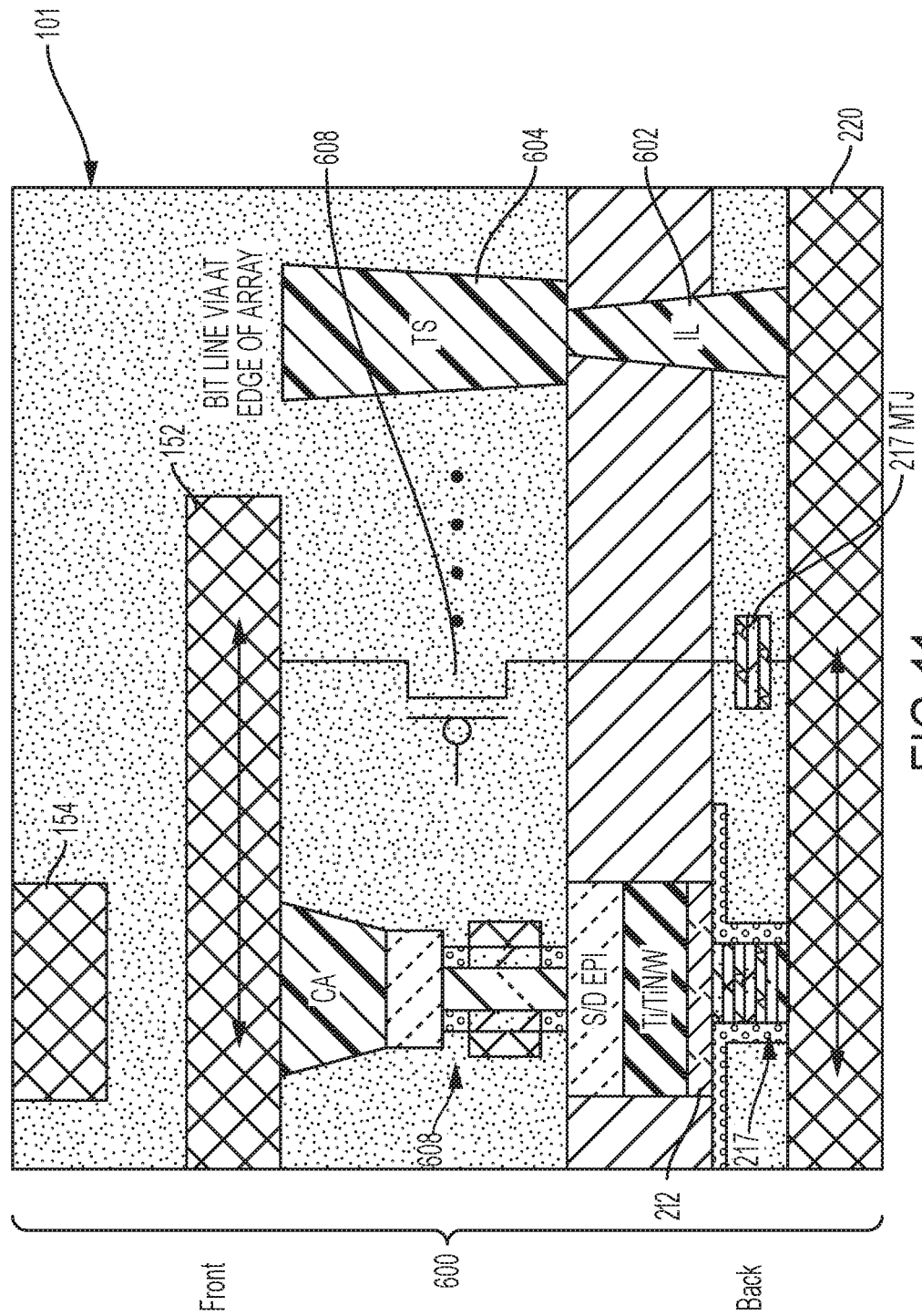
FIG. 11 is a cross-sectional view of a completed MRAM device including a back-side memory element and front-side memory access VTFET according to embodiments of the invention.

With reference now to FIG. 11, a completed MRAM device 600 is illustrated that includes a back-side memory element 217 and a front-side VTFET 608. The back-side memory element 217 can be constructed as a MTJ, for example. A circuit schematic is superimposed on the MRAM device 600 to assist in identifying the some of the components. For example, the circuit schematic illustrates that the VTFET 608 is connected between a source line 152 and the memory element 217. Accordingly, the VTFET 608 can serve as an access transistor of a memory bit/cell defined by the back-side memory element 217. The completed MRAM device 600 can also include an additional via 604 at the edge of the array to access the bit line 220 from the front-side of the wafer 101.

Figure 12:
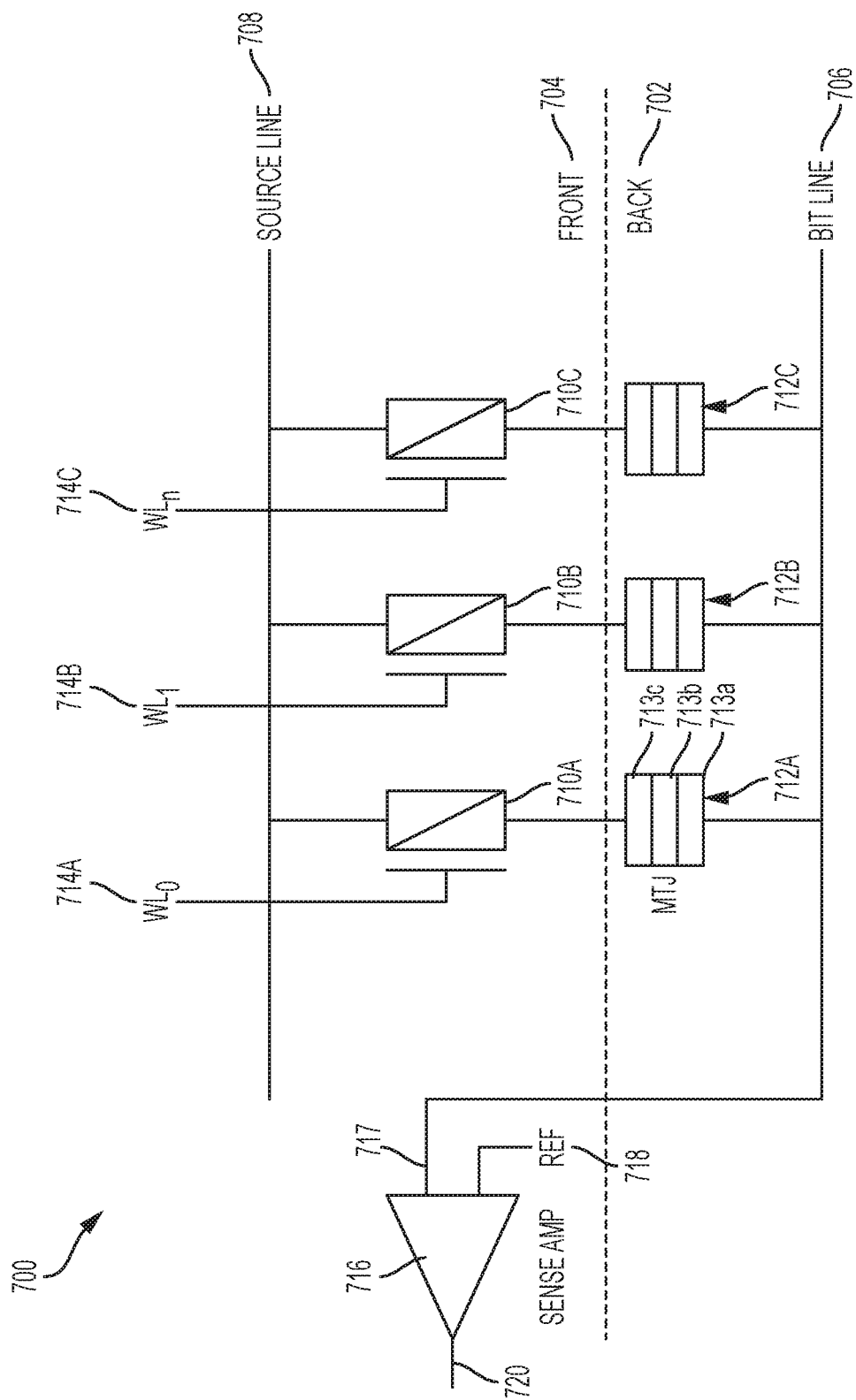
FIG. 12 is a schematic diagram representing an MRAM array according to embodiments of the invention.

Referring to FIG. 12, a schematic diagram representing an MRAM array 700 is illustrated. The MRAM array 700 is formed on a wafer that includes a front-side 704 and a back-side 702. The front-side 704 contains a plurality of access transistor 710A, 710B, and 710C. Each transistor 710A-710C includes a first source terminal, a gate terminal, and a second source/drain terminal. Each first source/drain terminal is connected to a common source line 708 formed on the front-side 704. Each gate terminal is connected to a respective word line 714A, 714B, and 714C formed on the front-side 704.

The back-side 702 contains a plurality of MTJs 712A, 712B and 712C. Each MTJ 712a-712c can include a dielectric tunnel barrier layer 713b interposed between a fixed magnetic layer 713a, and a free magnetic layer 713c The second S/D terminal of each access transistor 710A, 710B and 710C extends into the back-side 702, and is connected to a first terminal of a respective MTJ 712A, 712B, and 712C. The opposite terminal of the MTJs 712A, 712B and 712C is connected to a bit line 706 formed on the back-side 702.

The MRAM array 700 further includes a sensing amplifier 716 formed on the front-side 704. The sensing amplifier 716 includes a bit line input terminal 717, a reference input terminal 718, and an output terminal 720. The bit line input terminal 717 is connected to the bit line 706. The reference input terminal 718 is connected to a reference voltage source. The read operation of a bit is performed by current sense amplifiers that compare the desired bit to a reference cell. The bit can be determined to be in a low or high state by evaluating the resistance of the cell versus a reference cell using the sense amplifier.

Turning now to FIG. 13, a first-side view (e.g., a front-side view) of a wafer 302 including a transistor array 300 according to one or more embodiments is illustrated in FIG. 13. The front-side 401 of the resulting transistor array 300 includes one or more transistors 308 connected to the word line 310 and the source line 304. The transistors 308 can be fabricated as a planar-type FET or a fin-type FET (finFET). The gate of each transistor 308 contacts the word line 310, and a first source/drain terminal of the transistor 308 contacts the source line 304 by way of via 416. The second source/drain terminal of the transistor 308 contacts one side of a MRAM element (not shown in FIG. 13) that is formed on the opposite side (i.e., back-side) of wafer 302. A bit line 306 is also formed on the back-side of the wafer 302 and contacts the second side of the memory storage element. The transistor array 300 can be fabricated according to a series of fabrication operations illustrated in FIGS. 14-18 as described in greater detail below.

Turning now to FIG. 14, an intermediate transistor array 300 taken along line A-A is illustrated following completion of a middle of line (MOL) fabrication process. The intermediate transistor array 300 includes a wafer 302 including a front-side 401 and a back-side 403. The front-side 401 includes a buried oxide (BOX) layer 404 and an intermediate layer 406. The BOX layer 404 is composed of various dielectric materials such as $SiO_2$, for example, and has a thickness ranging, for example, from approximately 5 nm to approximately 50 nm. The intermediate layer 406 is formed on a first surface of the BOX layer 404, and is composed of a semiconductor material including, but not limited to, Si. The thickness of the intermediate layer 406 ranges for example, for example, from approximately 2 nm to approximately 10 nm.

One or more transistors 308 are formed on an upper surface of the intermediate layer 406. Each transistor 308 includes a gate structure 412, a first source/drain region 411 and a second source/drain region 413. The gate structure 412 includes a gate 408 interposed between a pair of opposing spacers 410. The gate 408 can be formed from an electrically conductive material including tungsten (W) for example, and the spacers can be formed from a nitride material such as, for example, SiN.

The first S/D region 411 and the second S/D region 413 are formed at opposing sides of the gate structure 412. The first and second S/D regions 411 and 413 can be composed of, for example, Si, germanium (Ge), SiGe, silicon carbide (SiC), indium phosphide (InP), gallium arsenide (GaAs), the like, or a combination thereof. Various epitaxy processes can be performed to form the S/D region including, but not limited to, metal-organic CVD (MOCVD) epitaxy, molecular beam epitaxy (MBE), liquid phase epitaxy (LPE), vapor phase epitaxy (VPE), selective epitaxial growth (SEG), the like, or a combination thereof. The epitaxial source/drain regions can further be doped to a concentration greater than or equal to $5 \times 10^{19}$ $cm^{-3}$ via in situ doping during growth and/or subsequent implantation. The dopants can include, for example, boron, indium, or the like for a p-type transistor, and can include, for example, phosphorus, arsenic, or the like for an n-type transistor. The first S/D region 411 and the second S/D region 413 can be formed according to various epitaxy processes including, but not limited to, vapor phase epitaxy (VPE), molecular beam epitaxy (MBE) or liquid phase epitaxy (LPE) with a gaseous or liquid precursor, such as, for example, silicon tetrachloride.

The front-side 401 further includes a first ILD layer 414 and an electrically conductive via 416. The ILD layer 414 is formed on the upper surface of the intermediate layer 406 and encapsulates the transistors 308. The ILD layer 414 is composed of a dielectric material such as $SiO_2$, for example, and serves to electrically isolate the transistors 308 from one another. The via 416 extends through the ILD layer 414 and contacts the upper surface of the first S/D region 411. Accordingly, the source line (not shown in FIG. 14) can achieve electrical connection with the first S/D region 411.

The back-side 403 includes a second ILD 402 formed on an opposite side of the BOX layer 404. A punchthrough via 418 penetrates the intermediate layer 406 and BOX layer 404 to facilitate access of the back-side 403. The punchthrough via 418 includes a first end that contacts the second S/D region 413 of a given transistor 308, and a second end that extends into the second ILD 402.

Turning to FIG. 15, the transistor array 300 is illustrated following various BEOL processing techniques to form the word line 310 and the source line 304 on the font-side of the wafer 302. The source line 304 is formed by depositing a third ILD layer 420 composed of SiO$_2$, for example, on an upper surface of the first ILD 414. The third ILD layer 420 is patterned to form a cavity that exposes the underlying via 416. The cavity is filled with an electrically conductive material to form the source line 304 that contacts the via 416.

Still referring to FIG. 15, a fourth ILD layer 422 composed of SiO$_2$, for example, is deposited on an upper surface of the third ILD layer 420 and covers the source line 304. The word line 310 is formed on the upper surface of the fourth ILD layer 422, and is composed of an electrically conductive material. The fourth ILD layer 422 serves to electrically isolate the word line 310 from the source line 304. Although a single word line 310 is shown, additional metal lines and vias can be formed depending on application.

Turning to FIG. 16, the transistor array 300 is flipped after stacking a bonding film 452 and bulk handle wafer 454 on top of the word line 310. Prior to flipping the transistor array 300 (i.e., from the front-side 401 to the back-side 403), the bonding film 452 is formed on the upper surface of the word line 310, and is composed of an adhesive material or polyimide having a Si adhesive. Alternatively, the bonding material can also be an oxide-based or nitride-based film for dielectric bonding. The bulk handle wafer 454 is formed on the upper surface of the bonding film 452. The bonding film 452 is formed on the upper surface of the handle wafer 454 and then attached to wafer 101. The bulk handle wafer 454 can be composed of various materials such as Si, for example, can provide additional support when performing one or more subsequent fabrication processes.

Figure 17:
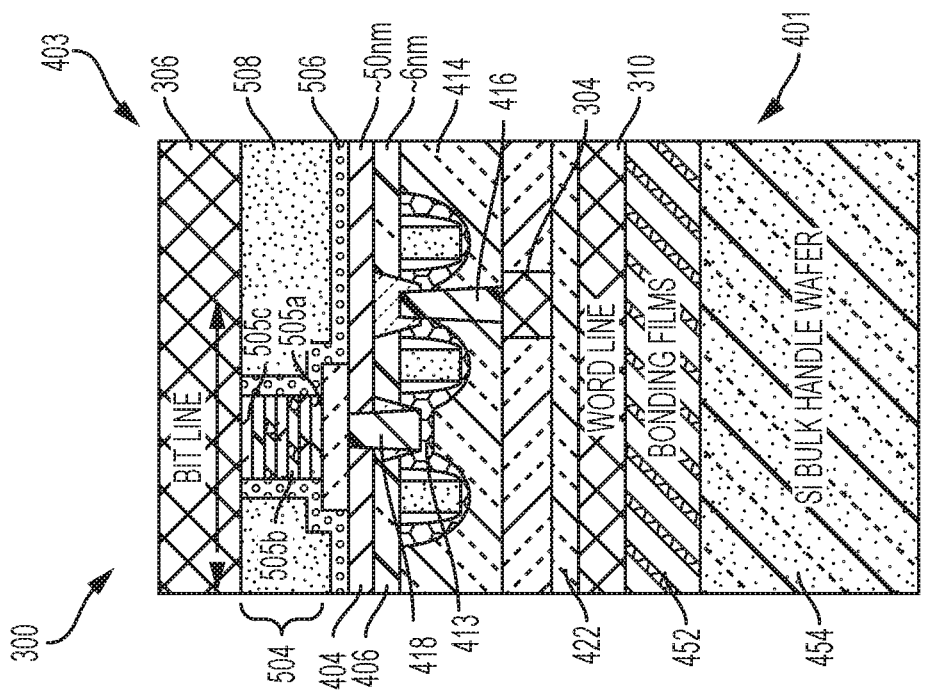
FIG. 17 illustrates the wafer after recessing the back-side according to embodiments of the invention.

Turning to FIG. 17, the transistor array 300 is illustrated following removal of the second ILD 402. The second ILD 402 can be removed by performing chemical-mechanical planarization (CMP) process, for example, which stops on an upper surface of the BOX layer 404. Accordingly, a portion of the punchthrough via 418 is accessible at the surface of the BOX layer 404.

Figure 18:
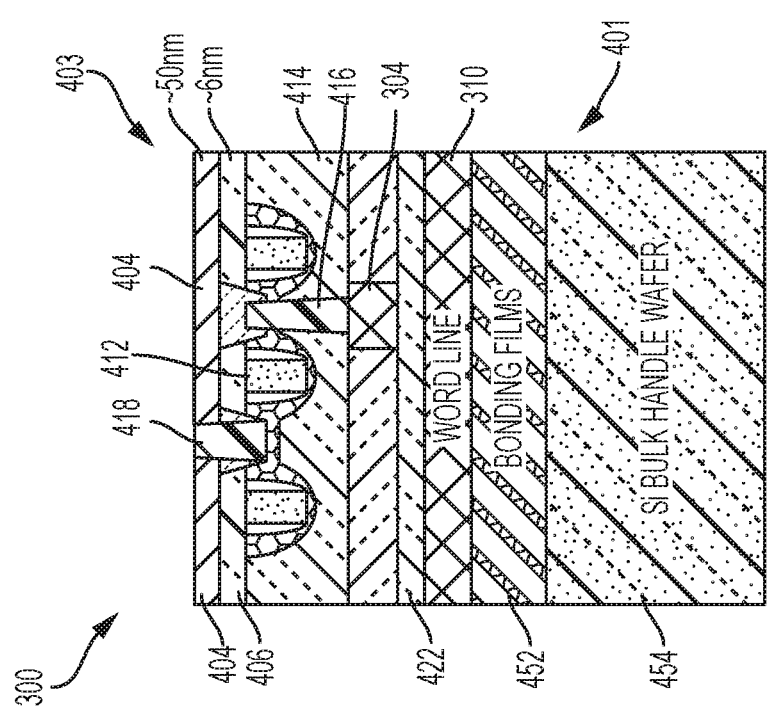
FIG. 18 illustrates the memory array following formation of a memory storage element and a bit line according to embodiments of the invention.

Referring now to FIG. 18, the transistor array 300 is illustrated as an MRAM array following formation of a MRAM element 504 and the bit line 306. Although a single MRAM element 504 and bit line 306 are shown, it should be appreciated that additional MRAM elements and bit lines can be formed corresponding to additional transistors 308n formed on the wafer 302.

The MRAM element 504 defines a MTJ capable facilitating magnetic storage to form a MRAM bit/cell. The MRAM element 504 is shown formed on top of a memory contact composed of TaN, for example. The MRAM element 504 can be formed by depositing a stack of MTJ layers 505a, 505b, and 505c on the upper surface of the BOX layer 404, and then patterning the MRAM stack such that a portion of the MRAM stack remaining on top of the memory contact 505 defines the MRAM element 504. The MTJ layers 505a-505c include a fixed magnetic layer 505a, a dielectric tunnel barrier layer 505b, and a free magnetic layer 505c. The fixed magnetic layer 505a and the free magnetic layer 505c are composed of a ferromagnetic material. The dielectric tunnel barrier layer 505b is composed of an oxide or metal-oxide material such as aluminum oxide (AlO$_2$), for example. The dielectric tunnel barrier layer 505b has a thickness that allows electrons to tunnel from the free magnetic layer 505c to the fixed magnetic layer 505a. Although three MTJ layers are described, it should be appreciated that the MRAM element 504 is not limited thereto, and can include additional MTJ layers.

A memory stack insulating film 506 is deposited on an upper surface of the BOX layer 404 and conforms to the outer surfaces of the MRAM element 504. The memory stack insulating film 506 is composed of a nitride material such as silicon nitride (SiN), for example, and is deposited according to a chemical vapor deposition (CVD) process, for example. An etching process is performed to recess an upper portion of the memory stack insulating film 506 and expose the underlying MRAM element 504.

Still referring to FIG. 18, a fifth ILD layer 508 composed of SiO$_2$, for example, is deposited on the memory stack insulating film 506 to encapsulate the MRAM element 504. The fifth ILD layer 508 is then recessed to expose an upper surface of the memory stack insulating film 506. A RIE process can be performed to recess the fifth ILD layer 508 and can be continued until the upper surface of the memory stack insulating film 506 is removed and the underlying MRAM element 504 is exposed. Alternatively, a first etching process can be performed to recess the fifth ILD layer 508 until the upper surface of the memory stack insulating film 506 is exposed. A different etching process (e.g., an etching process using a different chemistry) can then be performed to remove the upper surface of the memory stack insulating film 506 and expose the underlying MRAM element 504.

With reference now to FIGS. 19 and 20, a cross-sectional view of an intermediate semiconductor device 100 is illustrated according to one or more embodiments of the invention. Referring to FIG. 19, the intermediate semiconductor device 100 is illustrated after flipping the wafer 101 to expose the backside. The semiconductor device 100 includes a VTFET having a gate structure 113 interposed between a first S/D region 106 and a second S/D region 116.

The intermediate semiconductor device 100 further includes a buried insulator layer 450 on an upper surface of the first S/D region 106, and an off-set punchthrough via 455 that extends through the buried insulator 450 to contact the first S/D region 106. In one or more embodiments of the invention, the buried insulator 450 and the off-set punchthrough via 455 are formed on the front-side of the wafer, i.e., before flipping the wafer 101 to expose the backside. The length of the first S/D contact 106 is greater than the length of the second S/D contact 116. In this manner, the first S/D contact 106 provides an extended portion 107, which extends beyond the second S/D contact 116 and supports a portion an end of the off-set via 455. The buried insulator layer 450 can include a layer composed of an oxide material such as, for example, SiO$_2$. The off-set punchthrough via 455 can be composed of an electrically conductive material, such as a metal material.

Turning to FIG. 20, an off-set memory element 217 is formed from on an upper surface of the off-set punchthrough via 455. The off-set memory element 217 can include a memory contact 212 formed on an upper surface of the off-set punchthrough via 455, and a plurality of MTJ layers stacked on the memory contact 212. The formation of the off-set memory element 217 can be achieved by performing similar fabrication techniques used to form the 217 illustrated in FIGS. 9 and 10. A bit line 220 is formed on an upper surface of the ILD layer 219 and contacts an upper surface of the off-set memory element 217 to form a completed MRAM semiconductor device 100.

Figure 21:
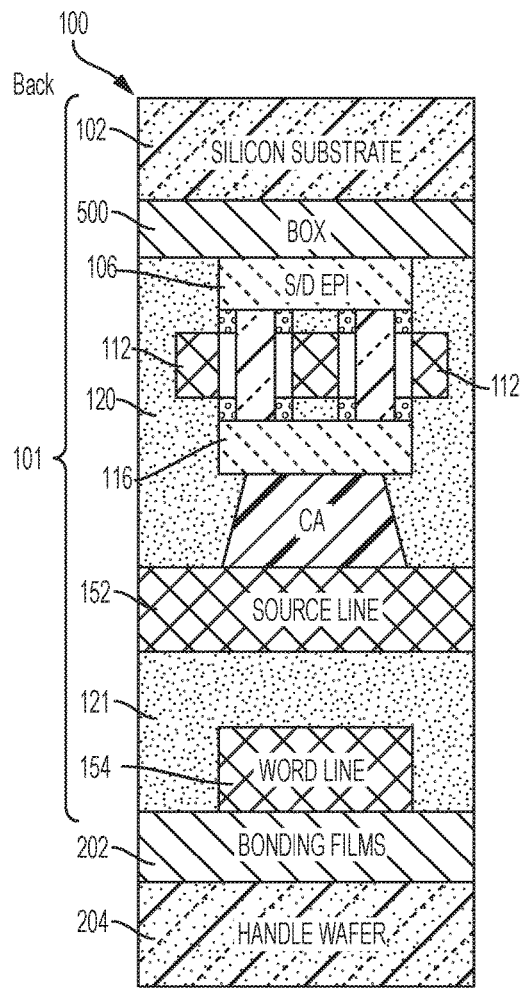
FIG. 21 is a cross-sectional view of a VTFET formed on a wafer according to embodiments of the invention.
Figure 22:
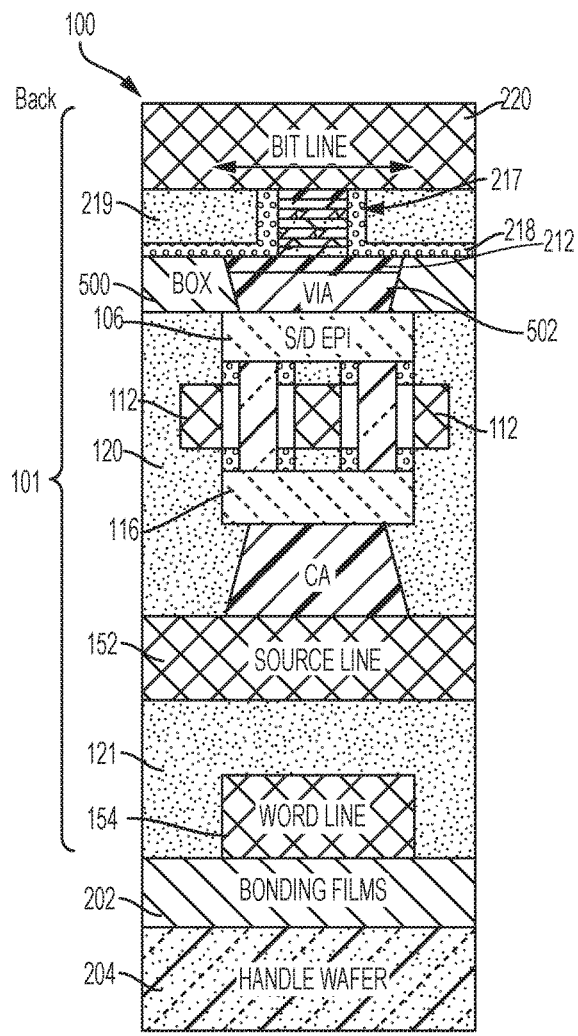
FIG. 22 illustrates the wafer following formation of a MRAM device including a backside via/contact formed on a source/drain region of the VTFET.

With reference now to FIGS. 21 and 22, a cross-sectional view of an intermediate semiconductor device 100 is illustrated according to one or more embodiments of the invention. Referring to FIG. 21, the intermediate semiconductor device 100 includes a VTFET having one or more channel regions 110 that extend between a first S/D region 106 and a second S/D region 116. A gate structure 113 wraps around the exterior portions of the channel regions 110.

The intermediate semiconductor device 100 further includes a buried insulator layer 500. The buried insulator layer 500 is formed on an upper surface of the first S/D region 106. The buried insulator layer 500 can be composed of an oxide material including, but not limited to, $SiO_2$.

Turning to FIG. 22, a completed MRAM semiconductor device is illustrated following formation of a backside via/contact 502 formed on an upper surface of the first S/D region 106. The backside via/contact 502 can be formed by removing a portion of the buried insulator layer 500 to form a void (not shown) that exposes the upper surface of the first S/D region 106. The void is then filled with an electrically conductive material such as a metal material, for example, to form the backside via/contact 502.

Still referring to FIG. 22, a memory element 217 is formed on an upper surface of the backside via/contact 502. The memory element 217 can include a memory contact 212 formed on an upper surface of the backside via/contact 502, and a plurality of MTJ stacked on the memory contact 212. The formation of the memory element 217 can be achieved by performing similar fabrication techniques used to form the 217 illustrated in FIGS. 9 and 10. A bit line 220 is formed on an upper surface of the ILD layer 219 and contacts an upper surface of the memory element 217 to form the MRAM semiconductor device 100.

As described herein, various non-limiting embodiments of the invention addresses shortcomings of the prior art by providing a MRAM device having a back-side memory architecture that overcomes MTJ height constraints that hinder conventional BEOL fabrications techniques. This back-side memory architecture also allows for passing a back-side bit line, along the edge of the memory array, to the front-side thereby further reducing the overall footprint of the MRAM device.

One or more embodiments of the present invention are described herein with reference to the related drawings. Alternative embodiments can be devised without departing from the scope. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based at least in part upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

A recessing process includes any process, such as etching, grinding, etc., that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage.

By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to one or more embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The description of one or more embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a memory device, the method comprising:
    forming, on a first side of a semiconductor wafer, a semiconductor device including at least one gate structure and a first source/drain structure that includes a first source/drain region, the semiconductor wafer extending along a first axis to define a horizontal length, a second axis orthogonal to the first axis to define a horizontal width, and a third axis orthogonal to the first and second axes to define a vertical height;
    forming, on a second side of the semiconductor wafer opposite the first side, a memory storage element;
    depositing an interlayer dielectric (ILD) on the memory storage element and removing a portion of the ILD to expose an upper surface of the memory storage element; and
    forming, on the second side of the semiconductor wafer, a third electrically conductive element that directly contacts the upper surface of the memory storage element, the third electrically conductive element defining a bit line,
    wherein the memory storage element is in electrical communication with a second source/drain structure of the semiconductor device different from the first source/drain structure, the second source/drain structure including a second source/drain region and a source/drain contact interposed between the second source drain region and the memory storage element, and
    wherein the first source/drain structure, the least one gate structure, the memory storage element, and the second source/drain structure are arranged vertically along the third axis to form a vertical-type field effect transistor (VTFET).

2. The method of claim 1, further comprising:
    forming, on the first side of the semiconductor wafer, a first electrically conductive element that contacts the at least one gate structure to define a source line;
    forming, on the first side of the semiconductor wafer, a second electrically conductive element that is electrically isolated from the source line, the second electrically conductive element defining a word line.

3. The method of claim 2, wherein forming the semiconductor device further comprises:
    forming the second source/drain region on the first side of the semiconductor wafer.

4. The method of claim 1, wherein a lower surface of the memory storage element directly contacts the source/drain contact of the second source/drain structure.

* * * * *